United States Patent [19]
Leadbeater et al.

[11] Patent Number: 5,962,864
[45] Date of Patent: Oct. 5, 1999

[54] GATED RESONANT TUNNELING DEVICE AND FABRICATING METHOD THEREOF

[75] Inventors: Mark L. Leadbeater; Nalin K. Patel, both of Cambridge, United Kingdom

[73] Assignee: Kabushiki Kaisha Toshiba, Kawasaki, Japan

[21] Appl. No.: 08/912,925

[22] Filed: Aug. 15, 1997

[30] Foreign Application Priority Data

Aug. 16, 1996 [GB] United Kingdom .................... 9617284

[51] Int. Cl.$^6$ ..................... H01L 29/06; H01L 31/0328
[52] U.S. Cl. ................. 257/25; 257/30; 257/37; 257/38; 257/39; 257/197
[58] Field of Search ................. 257/14, 23, 25, 257/30, 37, 38, 39, 197, 198

[56] References Cited

U.S. PATENT DOCUMENTS

| | | | |
|---|---|---|---|
| 4,700,353 | 10/1987 | Gieson et al. | 372/45 |
| 5,079,774 | 1/1992 | Mendez et al. | 372/45 |
| 5,179,037 | 1/1993 | Seabaugh . | |
| 5,202,896 | 4/1993 | Taylor | 372/45 |
| 5,512,764 | 4/1996 | Seabaugh et al. | 257/25 |

FOREIGN PATENT DOCUMENTS

| | | |
|---|---|---|
| 0 460 793 | 12/1991 | European Pat. Off. . |
| 0 549 853 | 7/1993 | European Pat. Off. . |
| 0 645 858 | 3/1995 | European Pat. Off. . |
| 2 262 385 | 6/1993 | United Kingdom . |

OTHER PUBLICATIONS

L.L. Chang, et al., Appl. Phys. Lett., vol. 24, No. 12, pp. 593–595, Jun. 15, 1974, "Resonant Tunneling in Semiconductor Double Barriers".

T.C.L.G. Sollner, et al., Appl. Phys. Lett., vol. 45, No. 12, pp. 1319–1231, Dec. 15, 1984, "Quantum Well Oscillators".

S. K. Diamond, et al., Appl. Phys. Lett., vol. 54, No. 2, pp. 153–155, Jan. 9, 1989, "Resonant Tunneling Diodes for Switching Applications".

M. Henini, et al., III–Vs Review, vol. 7, No. 3, pp. 33–36, 1994, "Prospects for the Future of Resonant Tunnelling Devices—Part 1".

M. Henini, et al., III–Vs Review, vol. 7, No. 4, pp. 46–49, 1994, "Prospects for the Future of Resonant Tunnelling Devices—Part 2".

*Primary Examiner*—Minh Loan Tran
*Attorney, Agent, or Firm*—Oblon, Spivak, McClelland, Maier & Neustadt, P.C.

[57] ABSTRACT

A semiconductor device comprises mutually separated first and third barrier layers interposed between the first and second patterned terminals. The device operates by the resonant tunneling of carriers from the second terminal to the first terminal. The first terminal is patterned into a section and a plurality of layers comprising the mutually separated first and second barrier layers are formed on top of the first terminal. A second terminal is then formed on top of the plurality of semiconductor layers. The second terminal is then patterned so that it only overlies the first terminal in confined region. A front-gate is then formed on top of the patterned second terminal.

15 Claims, 7 Drawing Sheets

GATED RESONANT TUNNELING DEVICE AND FABRICATING METHOD THEREOF

BACKGROUND OF THE INVENTION

The present invention relates to a semiconductor device. The device in question is of a kind normally referred to as a tunneling device and particularly a resonant tunneling device.

The resonant tunneling device was originally described by L. L. Chang et al., Appl. Phys. Lett., 24, 595 (1974). The conventional resonant tunneling device is in the form of a diode, although the terminals are often called the 'collector' and the 'emitter'. Typically the device comprises a quantum well layer (e.g., GaAs) on either side of which is located a respective barrier layer (e.g., AlGaAs).

With this conventional kind of device, application of a bias voltage between the emitter and the collector causes conduction through the layers. At low voltages only a small current flows. However as the bias voltage increases, so does the current. When the energy matches that of a quasi-bound state in the quantum well, electrons can tunnel through the barrier layers so that current freely flows from emitter to collector. At this bias voltage, the quantum well is said to be in resonance, and this value of the bias may be termed the 'resonant voltage'.

As the bias voltage is increased beyond the resonant voltage the energy becomes higher than that of the quasi bound state so that tunneling is inhibited. This gives rise to a region of negative differential resistance above the resonant peak in the IV characteristic. Thus sweeping the collector-emitter bias voltage from a voltage below the resonant voltage to a voltage above the resonant voltage shows a peak in the tunneling current centered around the resonant voltage, this peak in termed the tunneling peak.

Since tunneling is a very fast mechanism of charge transport, resonant tunneling devices offer the potential of extremely high speed operation. They have been described as oscillators (e.g., T. C. L. G Soliner et al., Appl. Phys. Lett., 45 1319 (1984)) and switches (e.g., S. K. Diamond et al., Appl. Phys. Lett., 54 153 (1989)). Oscillation frequencies up to 712 GHz have been reported. These devices can be fabricated as far infrared detectors.

Progress in this field has been reviewed in two parts by M. Henini et al., III–V's Review, 7 33 (1994) (Part 1) and III–V's Review, 746 (1994) (Part 2). This notes the possibilities offered by the fabrication of a three terminal transistor like device.

For production of a good RTD, optimization of the tunneling peak characteristics are required. A large difference between the magnitude of the tunneling current on resonance and off resonance, termed the peak to valley ratio, is required. A fast operating speed also requires a narrow tunneling peak, i.e., a small voltage range over which resonant tunneling occurs. In two terminal devices it is only possible to tune these characteristics by the fabrication of the structure, i.e., variation in the growth materials conditions etc. A three terminal device allows these properties to be tuned after the device is fabricated.

BRIEF SUMMARY OF THE INVENTION

The present invention achieves the tuning of the tunneling characteristics in a very simple way. Carriers are emitted from the emitter which comprises a quantum well, the population characteristics of the emitter and hence the tunneling characteristics of the whole device are then modulated by the front-gate. For a resonant tunneling device a second quantum well is required such that resonance occurs when the energy states of the first and second quantum wells are aligned.

Thus in a first aspect the present invention describes a semiconductor device comprising a semiconductor substrate, mutually separated first and third barrier layers, a first quantum well, a first terminal and a front-gate, wherein independent ohmic contacts are provided to the first terminal and the quantum well, the first barrier layer being provided overlying the first terminal, the quantum well being provided overlying the first barrier layer, the second barrier layer being provided overlying the quantum well and the front-gate being provided overlying the first quantum well.

The first terminal will be taken to be the collector and the emitter will be represented by the first quantum well. Carriers from the emitter are injected across the barrier into the collector, however, reversal of the bias will result in the collector and emitter reversing roles. Therefore the terms collector and emitter can be used interchangeably.

For resonant tunneling, a second quantum well and barrier layer are required. Therefore, it is preferable if the semiconductor device according to the present invention further comprises a second quantum well being provided overlying the first barrier layer and a third barrier layer being provided overlying the second quantum well. Resonant tunneling is not limited to a device where there are three or less barrier layers. Therefore, the device may further comprise four or more barrier layers. For example, as a superlattice of barrier layers and quantum well layers.

For the avoidance of doubt, as used herein, the term 'barrier layer' will be taken to mean a layer which has a higher band-gap than its adjacent layers. Any reference to a layer 'overlying' another layer refers to the relevant layer being situated directly above the other layer, whether in direct contact with it or spaced apart therefrom by one or more other layers. The position 'above' means relative to the substrate being on the underside of the device. The position 'vertical' with reference to a layer means perpendicular to the plane of that layer. The term 'independent contact' with to a contact made to a layer means that the contact to the specified layer makes no other electrical contact to another layer in the structure.

The principle of operation of the resonant tunneling device is provided by the tunneling of carriers from the emitter to the collector through the third barrier and a quasi-bound state formed in the second quantum well and through the first barrier layer to the collector.

In a preferred layer structure it is convenient if the first terminal is formed from a highly doped $n^+$ layer, this layer is embedded far into the structure. A highly doped $n^{30}$ layer is relatively easy to contact. This can be realized by a semiconductor device according to the present invention wherein the first terminal comprises a highly doped semiconductor layer.

To supply electrons to the first quantum well it is preferable if the second barrier layer is doped.

To obtain a high mobility device, it is preferable that the carriers in the first quantum well are separated from the dopants in the third barrier layers by means of a spacer layer. Thus it is preferable in a device according to the present invention wherein the second barrier layer is a modulation doped barrier layer comprising a doped barrier layer and an undoped spacer layer, the spacer layer being adjacent to the first quantum well.

Recently there has been much interest in producing devices where the states through which the carriers tunnel are essentially zero dimensional in nature. A carrier in a zero dimensional state can only occupy predefined energy levels in all three dimensions. The area through which the carriers tunnel in a device according to the present invention is defined by the area which the emitter overlies the first terminal. If this area is small so that the energy of the carrier become quantized in the direction perpendicular to the growth direction then the device becomes a zero dimensional resonant tunneling diode as the carriers are confined in the third dimension in the quantum well interspersed between the two barriers. This type of device can be easily realized in the present invention if the area perpendicular to the growth direction through which tunneling occurs is small so that the energy of the carrier is confined to tunnel through the area defined by the overlap of the collector and the patterned emitter. For this purpose, a small area is defined to be preferably less than 4 $\mu m^2$, e.g., of the order of 1 $\mu m^2$. This allows the possibility of fabricating a device which operates using single electron effects simply by this method. Thus, in some cases it is preferable that the present invention relates to a semiconductor device as described above wherein the area of the device through which tunneling occurs is less than 4 $\mu m^2$.

It is preferable in many cases for the quantum wells not to be strained. This is possible in a device according to the present invention wherein the quantum well is formed in a semiconductor layer which possesses a similar lattice constant to the lattice constant of the adjacent semiconductor layers. For the avoidance of doubt as used herein this document, two layers which possess 'similar lattice constants' are defined to be two layers which possess lattice constants which are very close to each other or one lattice constant is close to an exact multiple of the other lattice constant.

The above discussion has referred to the present invention in terms of one carrier type, i.e., either electrons or holes. However, the present invention should not be limited to this. The second barrier may be of an opposing conductivity type to the first terminal. Thus the device may be configured to operate as an LED or Laser structure where light is emitted due to the recombination of electrons and holes.

It is possible to produce such a structure via a number of methods, the problem which has to be overcome during the processing is making independent contact to the emitter and the first terminal. A first solution to this is to contact to the first terminal by etching away the layers lying above where the contact is required, preferably far away from the tunneling region. A convenient way to pattern the emitter would be by etching. Contact to the emitter could then be easily achieved by a shallow ohmic contact technology such as PdGe. The front-gate could be a metallic layer defined over a region of the emitter away from where the emitter contacts are to be placed. The contact to the metallic layer need not be annealed into the structure.

Thus in a second aspect the present invention is a method of fabricating a semiconductor device, the method comprising the steps of:

forming a first terminal on a semiconductor substrate;

forming a plurality of semiconductor layers comprising a first barrier layer over the substrate and the first terminal;

forming an emitter over the plurality of semiconductor layers;

patterning the emitter so that there are predefined regions where the plurality of semiconductor layers is only confined between the patterned emitter and collector and forming a front-gate overlying the patterned emitter.

A particularly simple and versatile technique for fabricating a semiconductor device according to the present invention is achieved by patterning the first terminal as well as the emitter. This could be realized in a semiconductor device according to the present invention wherein the first terminal is patterned, the patterned collector and the first quantum well is patterned to form a patterned emitter wherein the patterned emitter only overlies the patterned collector in a predefined region so that the first barrier layer is only interspersed between the patterned emitter and patterned collector in a predetermined conduction region.

For the avoidance of doubt, the term patterned with reference to a layer relates to a layer where there is a variation in the characteristics of that layer perpendicular to the direction of growth. For example, there could be a variation in the doping through the layer or the layer may be etched in certain regions.

There are many methods which can be applied to pattern the collector embedded into the device. Thus the present invention also relates to a method for fabricating a semiconductor device as described above wherein the patterned collector is patterned using ion beam damage techniques. This could be employed is for example, the collector was formed from a highly doped semiconductor layer, which could be irradiated with an ion beam to render regions of the highly doped semiconductor layer non-conducting.

A second example of a method which could be used to pattern the collector in a device as described above is by wet or dry etching to form a patterned collector with oblique facets forming the side walls of the collector.

The emitter and the collector may be patterned into a variety of shapes, it is convenient however in a device according to the present invention wherein the collector and emitter are substantially elongate sections. From a fabrication point of view it is more preferable if the present invention relates to a semiconductor device wherein the substantially elongate sections are substantially rectangular. It is advantageous from a fabrication point of view if the semiconductor device according to the present invention relates to a device wherein the patterned emitter is arranged substantially perpendicular to the patterned collector.

In many cases it may be advantageous to fabricate an array of tunneling structures according to the present invention, this is possible by patterning the emitter and the collector into a plurality of sections so that the emitter and the collector define an array of areas where they overlap. This can be realized in a device according to the present invention wherein the patterned collector and patterned emitter comprise a plurality of sections arranged so that the mutually separated first and third barrier layers are only interspersed between the patterned collector and the patterned emitter in predefined regions.

The collector is embedded into the structure, a plurality of semiconductor layers will be formed over the collector. In order to ensure that these layers are continuous over the profile of the patterned collector it is preferable that the present invention relates to a device according to the present invention wherein the patterned collector comprises oblique facets at the sidewalls of the patterned collector. An abrupt patterned collector sidewall could result in the formation of etch defects at the side of the tunneling region and could hinder transport through the patterned emitter.

The present invention relates to a semiconductor where the growth occurs in three dimensions. This allows the possibility of varying the doping type of a layer within the layer itself and forming a thin p-n junction confined to a layer. This can be exploited in many ways, for example, it can be used to achieve further confinement in the region defined by the overlap of the collector and the emitter. It is then possible to bias one side of the thin p-n junction to act as a side gate within the layer. This can be realized in a semiconductor device according to the present invention wherein a doped layer is provided above the collector, the doped layer further comprises sections of opposing conductivity types.

The first terminal may also comprise a doped layer with strips of opposing conductivity types. This is conveniently achieved if the doped layer comprises an amphoteric dopant and a surface of the substrate on which the first terminal is formed may comprise oblique facets or the first terminal may be formed on a relief region which overlies the substrate, wherein the relief region comprises oblique facets. To clarify, a relief region is a layer or plurality of layers which overlies the substrate. The first terminal region overlies the relief region. The relief region may comprise doped or undoped layers.

One particularly convenient method of achieving this variation of the doping within a layer is by using an amphoteric dopant, for example Silicon, in the case of the GaAs based structures. The Silicon can be incorporated as a p-type dopant on the layers formed on the oblique facets and an n-type dopant everywhere else. The exact nature of the silicon dopant is dependent on many factors such as the exact crystallographic orientation of the planes on which the layers are to be formed and the precise growth conditions. Thus it is possible to realize a layer with sections of opposing conductivity types grown over an etched substrate in a device according to the present invention wherein the doped layer comprises an amphoteric dopant.

The ability to produce a layer which comprises sections of opposing conductivity types is not only useful in the plurality of semiconductor layers. Thus the present invention also relates to a semiconductor device wherein the front-gate comprises a doped semiconductor layer, the doped layer further comprises sections of opposing conductivity types. The advantage of this structure lies in the fact that it is possible induce p-n junctions within the front-gate creating further confinement. This can be easily realized as described above wherein the doped layer comprises an amphoteric dopant. This gives rise to the extremely simple fabrication of a 'self aligned' front-gate. Growing an amphoterically doped front gate over the second terminal and over the etched patterned collector will result in a front-gate with say a $p^+$ region directly over the oblique facets of the patterned collector and an $n^+$ region everywhere else, this is of course dependent as above on the exact crystallographic orientation of the planes on which the front-gate is formed and the growth conditions. Thus the section of the front-gate directly above the patterned collector is isolated. The emitter can now be patterned as before and here the front-gate is also etched.

Therefore, there is an isolated region of the front-gate overlying the area where the patterned emitter and collector overlap, the extent of this region of the front-gate is defined by the processes which pattern the emitter and the collector. Thus the present invention also relates to a semiconductor device a described previously wherein the front-gate forms a self aligned gate directly overlying the region where the collector and the emitter overlap. In order to contact to the isolated region of the front-gate it is convenient if the front-gate further comprises a doped semiconductor layer of a single conductivity type. This layer makes contact to the isolated region of the first front-gate layer, and thus allows external contact to the isolated region to be made away from the region where the patterned emitter and collector overlap.

From the above discussion it can be seen that an extremely versatile method for producing a device according to the present invention is provided by using wet or dry etchants to produce the embedded patterned layers with oblique facets at the sidewalls of the embedded patterned layers, and the use of amphoteric dopants in the layers grown over the patterned layers.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

A semiconductor device according to the present invention can be fabricated from a wide range of compounds, here however, the device will be described with respect to a GaAs based structure.

Figure 1:
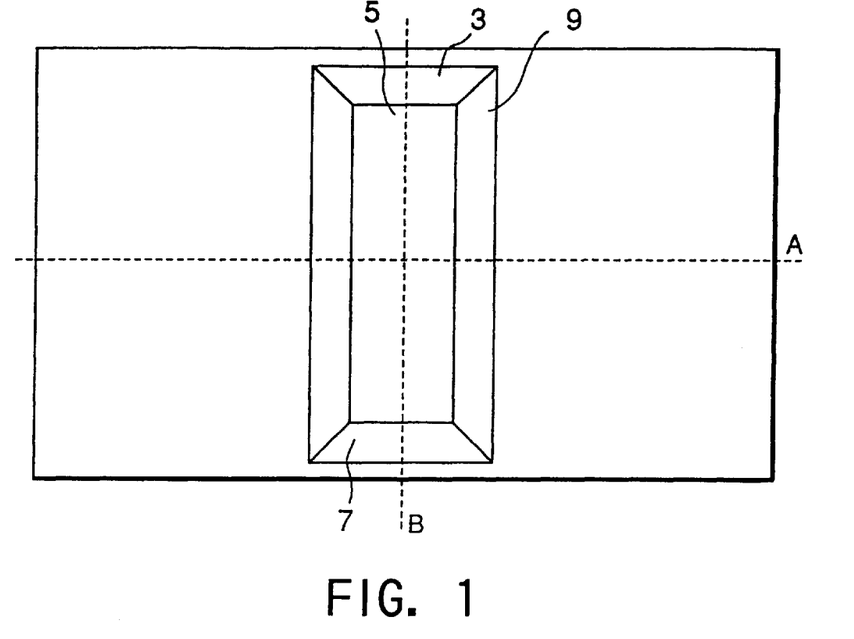
FIG. 1 shows a plan view of a semiconductor device according to the present invention after a first growth and etch step.
Figure 2:
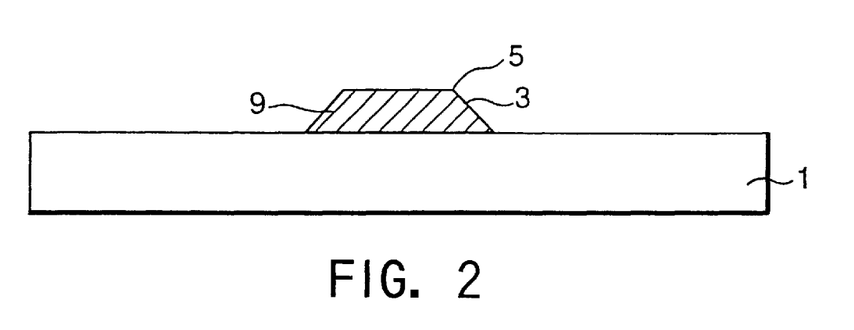
FIG. 2 shows a cross section through the semiconductor device according to the present invention as shown in FIG. 1, the cross section is taken through the line marked A on FIG. 1.
Figure 3:
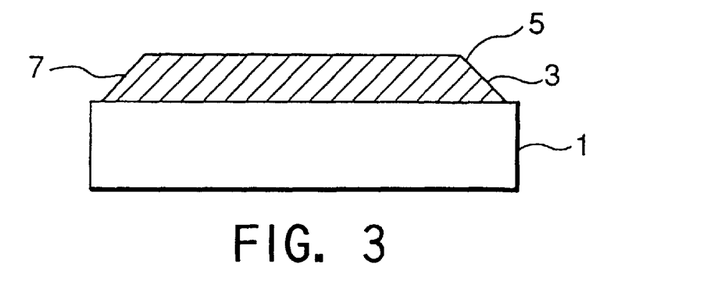
FIG. 3 shows a cross section through the semiconductor device according to the present invention as shown in FIG. 1, the cross section is taken through the line marked B on FIG. 1.

Referring to FIGS. 1 to 3, a highly doped $n^+$ GaAs layer 3, is formed on top of a semi-insulating GaAs substrate 1, to form a first terminal which in this case will be taken to be a collector. The highly doped $n^+$ layer is then selectively etched to form a patterned collector 5. The patterned collector 5, is patterned into a substantially rectangular section. The etchant is chosen so that oblique facets 7 and 9, are formed at the sidewalls of the patterned collector 5. FIG. 2 shows a cross section through the structure shown in FIG. 1 along line A. The long oblique facets 9, along the long sidewalls of the patterned collector 5, can be seen here. The angle which the long oblique facets 9, make with the plane of the substrate 1, can be controlled using either wet or dry etching techniques. FIG. 3 shows a cross section through the structure as shown in FIG. 1 along line B. The short oblique facets 7 along the short sidewalls of the patterned collector 5 can be seen here.

Figure 4:
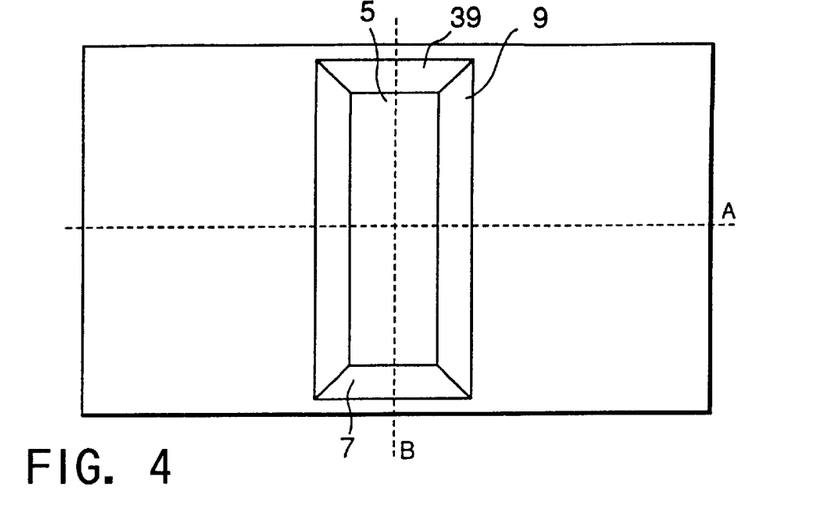
FIG. 4 shows a plan view of a semiconductor device according to the present invention as shown in FIG. 1 after a second growth step.
Figure 5:
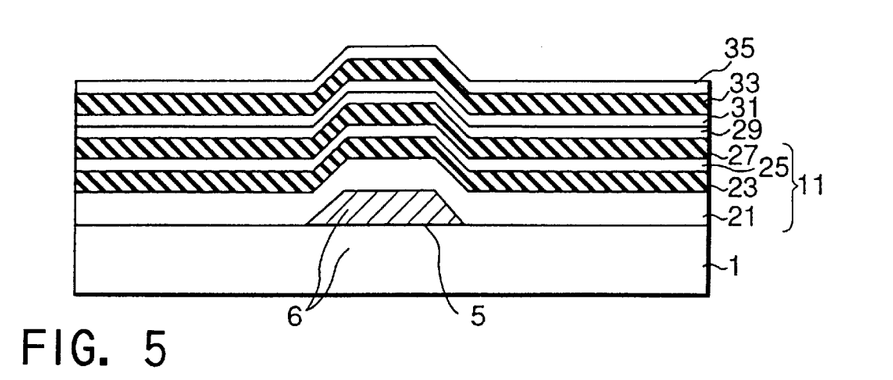
FIG. 5 shows a cross section through the semiconductor device according to the present invention as shown in FIG. 4, the cross section is taken through the line marked A on FIG. 4.
Figure 6:
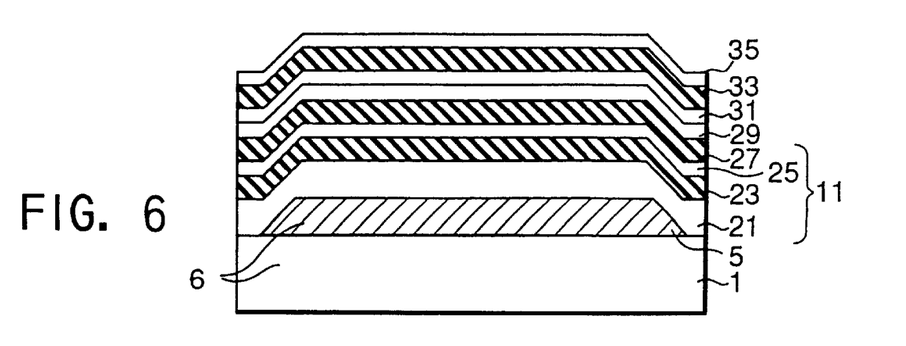
FIG. 6 shows a cross section through the semiconductor device according to the present invention as shown in FIG. 4, the cross section is taken through the line marked B on FIG. 4.

Referring to FIGS. 4 to 6, a plurality of semiconductor layers 11 is formed on top of the substrate 1 and the patterned collector 5, so that the plurality of semiconductor layers is in contact with and adjacent to both the substrate 1 and the patterned collector 5. The patterned collector 5, and the substrate 1 together form the patterned base layers 6. The plurality of semiconductor layers 11, follows the relief of the patterned base layers 6. The plurality of semiconductor layers 11 comprises, a thick GaAs buffer layer 21, the lower surface of the buffer layer 21 being in contact with the upper surface of the patterned base layer 6. A thin first AlGaAs barrier layer 23, is in contact with and adjacent to the upper surface of said buffer layer 21. A GaAs second active layer (second quantum well) 25, lies above and is in contact with the upper surface of the first barrier layer 23. Finally the plurality of semiconductor layers 11 is finished with an AlGaAs third barrier layer 27 which is adjacent to and in contact with the upper surface of the second active layer 25.

A second terminal which will be called the emitter 13, is grown on top of the plurality of semiconductor layers 11. The emitter 13 comprises first GaAs active layer (first quantum well) 29 which is in contact with the upper surface of the third barrier layer 27. A thin undoped AlGaAs spacer layer 31 is formed on the upper surface of the second active layer 29. A second doped AlGaAs barrier layer 33 is then formed above the spacer layer 31, so that the second barrier layer 33 is in contact with and adjacent to the upper surface of the spacer layer 31. Above the second barrier layer 33, is formed a GaAs cap layer 35, which completes the emitter 13. The cap layer 35, is adjacent to and in contact with the upper surface of the third barrier layer 33. The collector impression 39, can be seen through the plurality of semiconductor layers 11 and the emitter 13.

Figure 7:
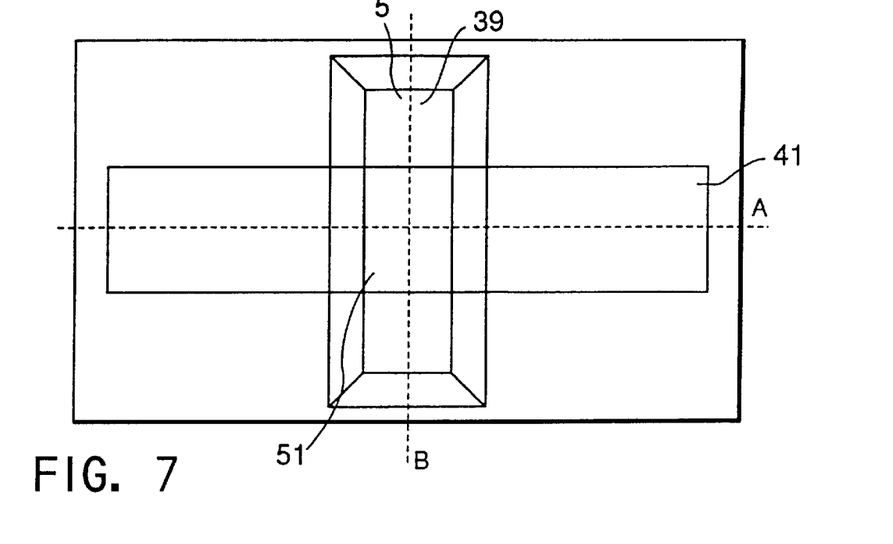
FIG. 7 shows a plan view of a semiconductor device according to the present invention as shown in FIG. 4 after a second etch step.
Figure 8:
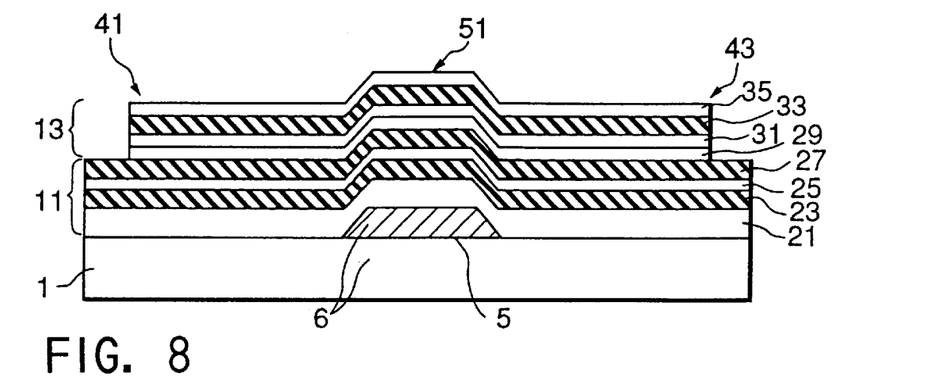
FIG. 8 shows a cross section through the semiconductor device according to the present invention as shown in FIG. 7, the cross section is taken through the line marked A on FIG. 7.
Figure 9:
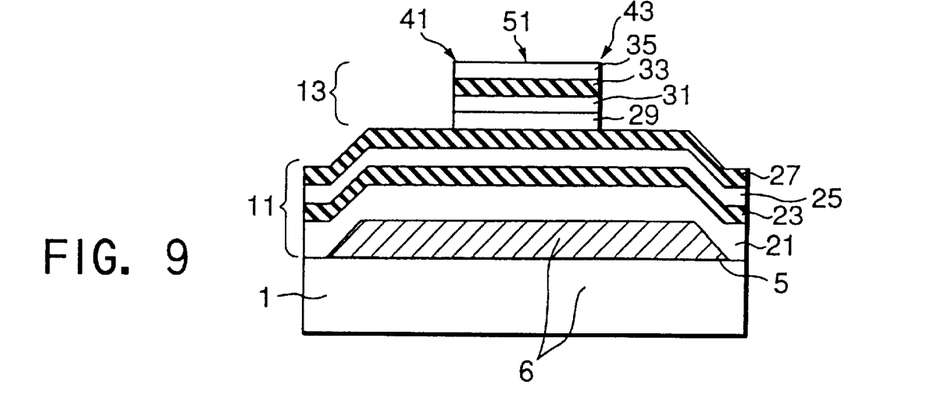
FIG. 9 shows a cross section through the semiconductor device according to the present invention as shown in FIG. 7, the cross section is taken through the line marked B on FIG. 7.

Referring to FIGS. 7 to 9, the emitter 13, is etched to define an elongate section, the patterned emitter 41. The etch profile of the sidewalls 43, of the patterned emitter 41, is not critical as no full semiconductor layers will be formed over the patterned emitter 41. The plurality of semiconductor layers 11 are thus sandwiched between the patterned collector 5 and patterned emitter 41 only in the shown confined region 51. The etch to pattern the emitter layer 13 can extend into the plurality of semiconductor layers 11, is not shown here.

Figure 10:
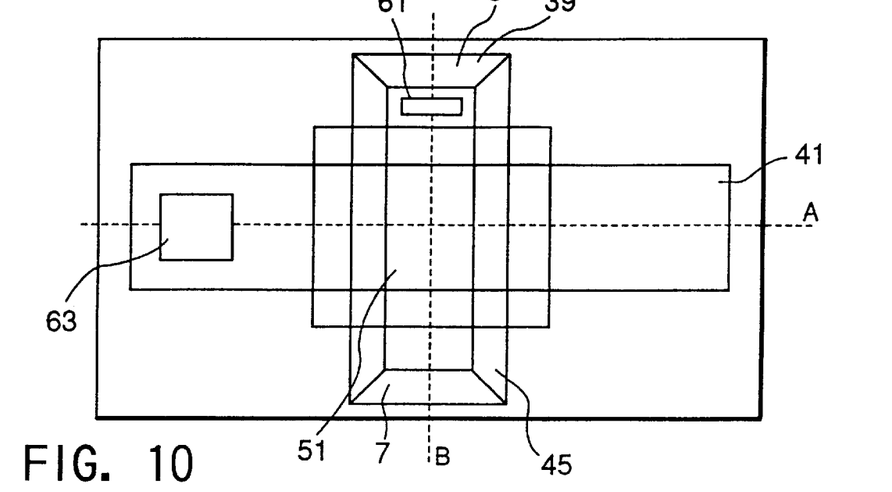
FIG. 10 shows a plan view of a semiconductor device according to the present invention as shown in FIG. 4 after full processing.
Figure 11:
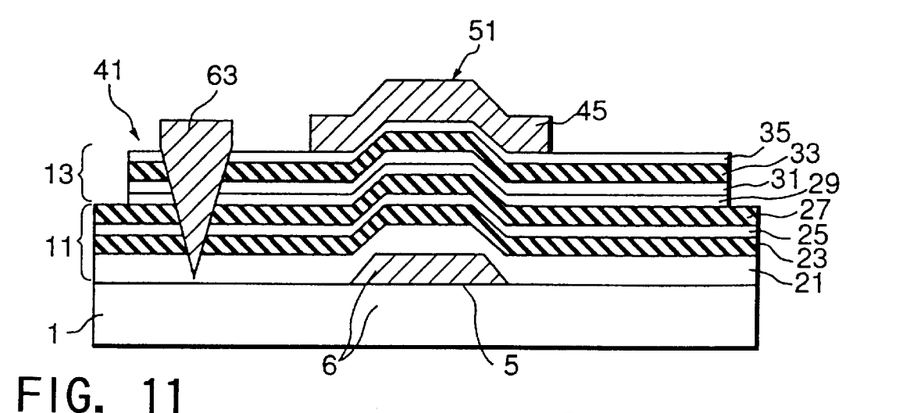
FIG. 11 shows a cross section through the semiconductor device according to the present invention as shown in FIG. 7, the cross section is taken through the line marked A on FIG. 7.
Figure 12:
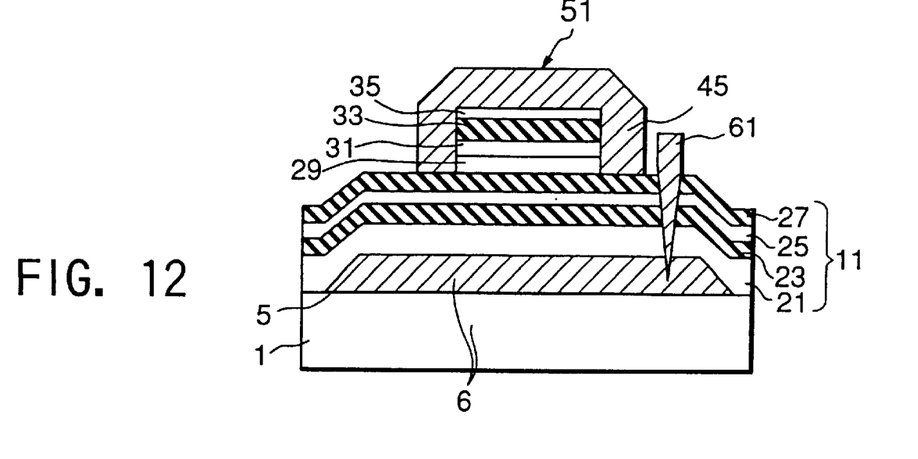
FIG. 12 shows a cross section through the semiconductor device according to the present invention as shown in FIG. 7, the cross section is taken through the line marked B on FIG. 7.

FIGS. 10 to 12 show the structure after final fabrication. To finish the structure, a metallic front-gate 45 is formed on top of the finally fabricated structure. The front-gate 45, is defined in the confined region 51, where the patterned emitter 41 and the patterned collector 5 overlie one another. FIG. 10 is a plan view of the structure, FIG. 11 is a cross section throughout the structure at line A and FIG. 12 is a cross section through the structure at line B. Collector Ohmic contacts 61 are provided to the patterned collector 5, this can be clearly seen in the cross section shown in FIG. 12. The ohmic contacts can be seen to diffuse through the plurality of semiconductor layers 11. This should not cause problem as the collector contact 61, cannot make an ohmic connection to the layers of the plurality of semiconductor layers 11. In this structure no layers of the plurality of semiconductor layers are doped and there are no carriers in the quantum well formed in the second active layer 25. An emitter ohmic contact 63 is provided to the patterned emitter 41, away from the confined region 51 where the patterned emitter 41 overlies the patterned collector 5. FIG. 11 shows the emitter ohmic contact 63, the emitter ohmic contact 63 does not make an ohmic contact to the plurality of semiconductor layers 11, for the same reasons as explained for the collector ohmic contact 61.

The function of the individual layers of the device will now be explained with reference to FIGS. 10 to 12. The principle of operation of the device is the injection of carriers from the patterned emitter 41 to the patterned collector 5 through the plurality of semiconductor layers 11. The electrons in the emitter are induced in the quantum well formed in the first active layer 29. The electrons are induced in this quantum well by means of the doped second barrier layer 33, the dopants in the barrier layer 33 are separated from the quantum well by means of a spacer layer 31, this is to increase the mobility of the electrons contained within the quantum well in the first active layer 29. An emitter collector bias is applied by emitter 63 and collector 61 ohmic contacts across the plurality of semiconductor layers 11. Carriers tunnel from the first active layer 29 to the second active layer 25 through the third barrier layer 27 which has a higher band-gap than the two active layers 29 and 25. The carriers then tunnel through the first barrier layer 23 from the second active layer 25 to the patterned collector 5. The thick buffer layer 21 is provided to separate the patterned collector 5 from the first barrier layer 23. The front-gate 45 is provided to tune the tunneling characteristics.

Figure 18:
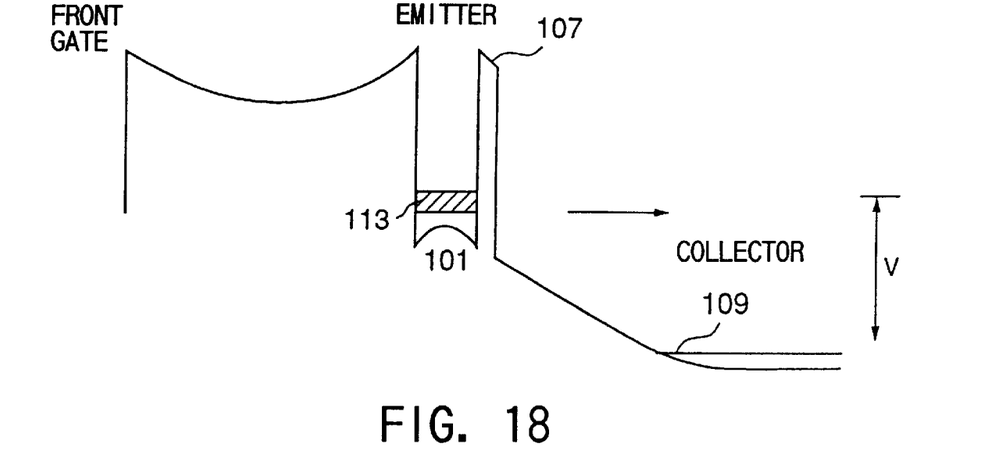
FIG. 18 shows a schematic band structure of a semiconductor device according to the present invention similar to that shown in FIG. 13 except here there is only one quantum well so resonant tunneling is not possible.

FIG. 18 is a schematic band structure of the simplest device according to the present invention where there is only one quantum well, the first quantum well 101. On application of an emitter/collector bias V, electrons can tunnel from the first quantum well 101, through the first barrier 107, to the collector 109. Changing the front-gate bias modulates the confining potential of the first quantum well 101 and hence the tunneling current characteristics.

Figure 13:
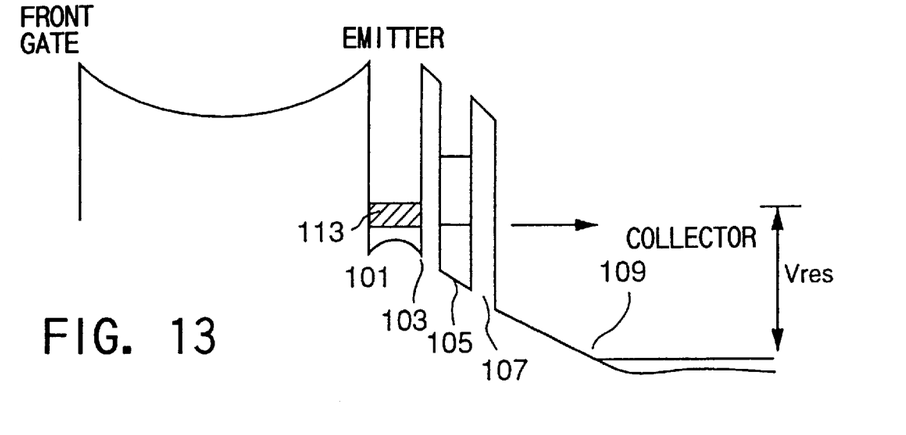
FIG. 13 shows a schematic band structure of a semiconductor device according to the present invention with a front-gate voltage applied.
Figure 14:
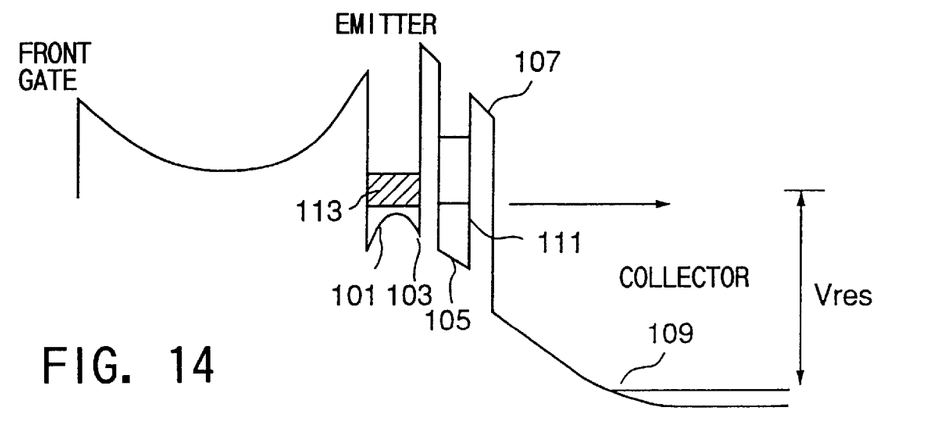
FIG. 14 shows a schematic band structure of a semiconductor device according to the present invention similar to that shown in FIG. 13 except with a different front-gate voltage applied.
Figure 19:
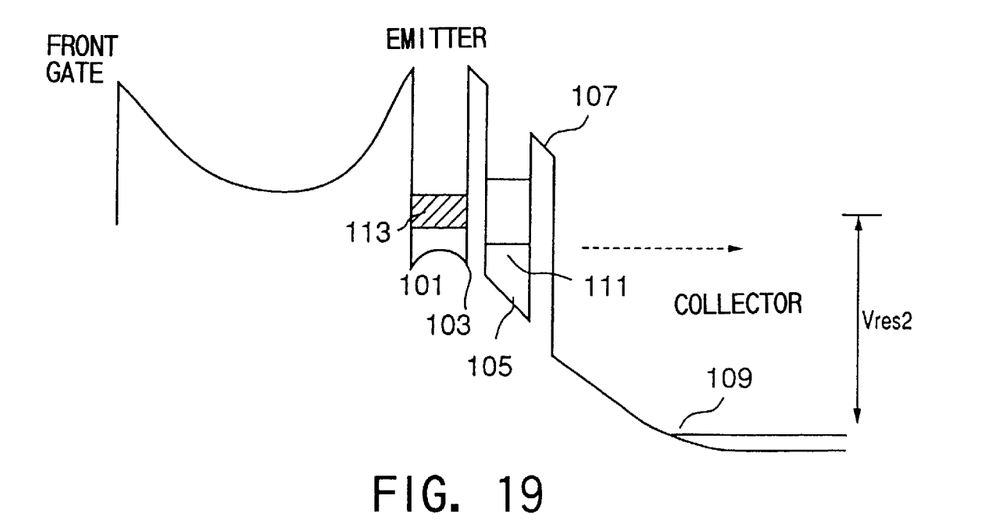
FIG. 19 shows a schematic band structure of a semiconductor device according to the present invention similar to that shown in FIGS. 13 and 14 except here a different emitter/collector bias is applied.

FIGS. 13, 14 and 19 show a schematic band structure of the device with two quantum wells, the action of the front-gate will be explained with reference to these figures. There are two parameters which can be varied to modify the band structures shown, the front-gate bias, and the collector/emitter bias on the diagrams indicated as Vres. In these figures, carriers tunnel from the first quantum well 101, through the third barrier 103, into the second quantum well 105, and then through the first barrier 107, to the collector 109. The wells are brought onto resonance when the first quantum well energy levels 113, align with the energy levels 111 of the second quantum well. The device is shown off resonance in FIG. 19 and on resonance in FIGS. 13 and 14. The levels are aligned by the emitter collector bias which is shown as Vres on the Figures. It has been discussed previously that for a device with good performance, the tunneling characteristics must posses a large peak to valley ratio and a narrow tunneling peak. These characteristics cannot be controlled by the collector/emitter bias. However, in this structure, by comparing the band diagrams of FIGS. 13 and 14 it can be seen that the band diagram of the first quantum well 101, is modified, by changing the front-gate bias. Allowing the tunneling peak characteristics to be tuned.

Figure 15:
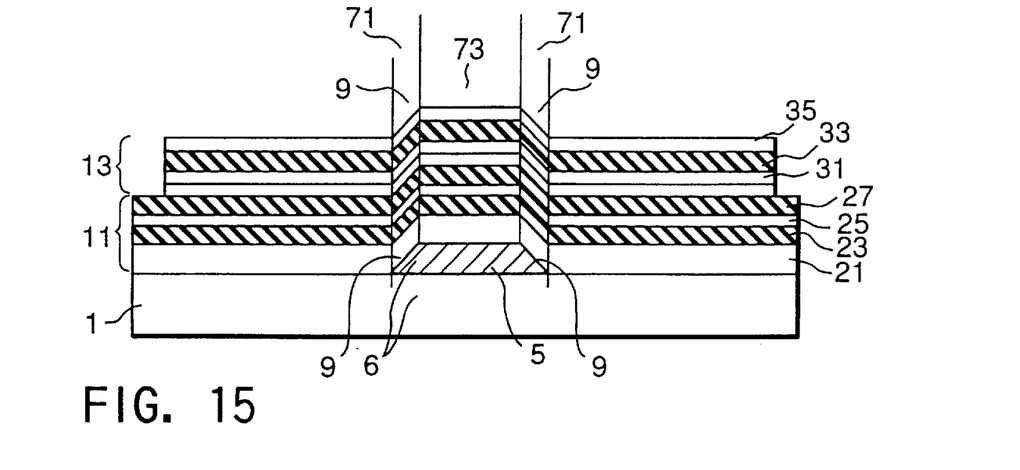
FIG. 15 shows a semiconductor device according to the present invention as shown in FIG. 8 indicating the regions of varying conductivity types.

FIG. 15, shows a variation on the device structure. The device is essentially the same as that shown in FIG. 8. The main difference here lies in the orientation of the oblique facets to the plane of the substrate 1. The angle which the oblique facets make with the substrate 1, is chosen to allow a doping variation over the relief of the patterned base layers 6. Only the profile of the long oblique facets 9, is shown in the figure. This is achieved if any doping in the subsequent layers is provided by an amphoteric dopant, i.e., Silicon. For example, if the crystallographic orientation of the substrate 1, is specified by the (100) plane, and the oblique facets 9 are (311)A planes 71, then growth of the subsequent layers by Molecular Beam with a Silicon dopant using standard conditions will result in the doping on the (100) planes being n-type and the doping on the (311)A planes 71, being p-type. The variation of the doping over the different facets is dependent to a certain extent on the growth conditions, growth at a very high arsenic pressure will result in the doping being n type across the relief of the patterned base layers 6.

The use of amphoteric dopants allows further variants on the basic structure, for example, it is possible to achieve an extra degree of confinement in the raised structure 73. The plurality of semiconductor layers 11, would be grown in a very similar manner as described before, except the first barrier layer 23 and the third barrier layer 27 are lightly Silicon doped. The layers will be grown under standard conditions. Therefore, the first and third barrier layers 23 and 27 are n type doped except on the long oblique facets 9. In the facet region 71, the first and third barrier layers 23 and 27 are p-type. This results in an extra degree of confinement of the carriers tunneling through the plurality of layers. The emitter 13 could then be grown at a higher Arsenic pressure or using a different n-type dopant, to allow the second barrier layer 33 to be n-type doped across the relief of the substrate. This layer would need to be n-type doped across the whole of the structure to allow contact to be made to it by the emitter ohmic contact 63 away from the patterned collector 5.

Figure 17:
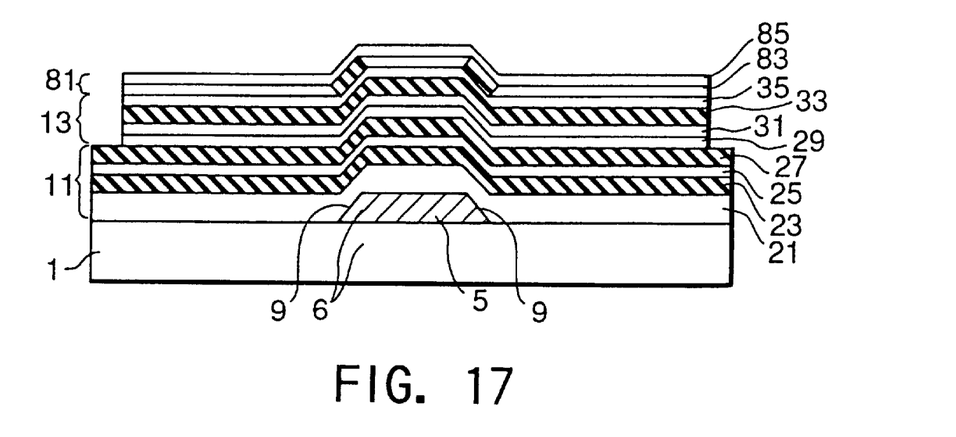
FIG. 17 shows a semiconductor device according to the present invention where a semiconductor front-gate is provided.

Another example of using an amphoteric dopant to fabricate the structure is shown in FIG. 17. Here, the plurality of semiconductor layers 11 is grown as described with reference to FIGS. 4 to 6, without doping of the first and third barrier layers 23 and 27. The patterned emitter 13, being grown at a high As pressure with an amphoteric dopant or under standard conditions with a non-amphoteric dopant so as to ensure n-type doping throughout the second barrier layer. Amphoteric doping, however, could be used to form a novel type of front-gate over the top of the substrate. To form the novel front gate 81 a heavily amphoterically doped GaAs first front-gate layer 83 is grown. The $n^+$ layer is grown under standard conditions so that the doping of the layer is p-type on the oblique facets 9 and n-type everywhere else. A second $n^+$ front-gate contact layer 85 is then grown on top of the first front-gate layer 83, and the second front-gate layer 85 is either amphoterically doped and grown at a higher As pressure, or it is doped with a non-amphoteric dopant so as it is n-type doped over the whole structure. The front-gate 81 is then patterned with the emitter 13 into a rectangular strip. This results in the first front-gate layer having an isolated $n^+$ region self aligned with the region where the patterned collector 5 and patterned emitter 41 overlap. This isolated n+ region can be contacted with the second front-gate layer 85.

Figure 16:
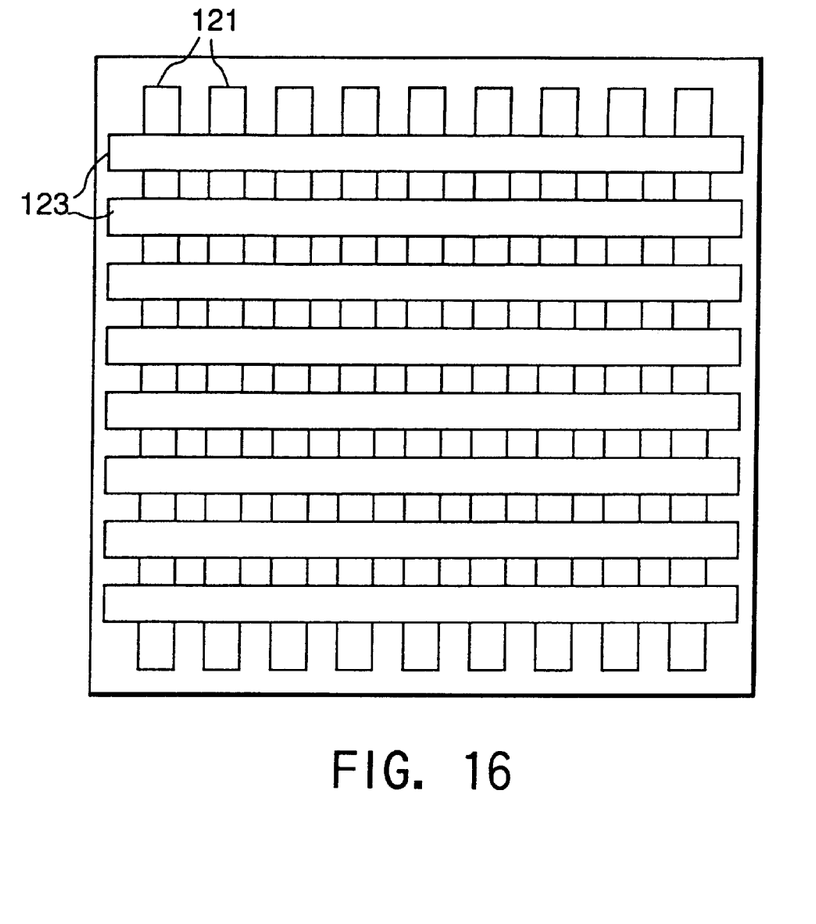
FIG. 16 shows a semiconductor device according to the present invention where an array of confined regions is defined.

It may also be required to form an array of enclosed areas according to the present invention. FIG. 16 shows a plan view of such a structure, the processing steps have been explained in detail with reference to FIGS. 1 to 9 except here the patterned collector comprises an array of elongate sections 121. The patterned emitter 123 also comprises an array of elongate sections so that there is an array of areas where the plurality of semiconductor layers are confined between the patterned collector and emitter.

In light of this disclosure, modifications of the described embodiment, as well as other embodiments, all within the scope of the present invention as defined by the appended claims, will now become apparent to a person skilled in the art.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

We claim:

1. A semiconductor device comprising:

a semiconductor substrate;

first to third barrier layers;

first and second quantum wells;

a first terminal; and a front-gate;

wherein the first barrier layer is provided overlying the first terminal, the second quantum well is provided overlying the first barrier layer, the third barrier layer is provided overlying the second quantum well, the first quantum well is provided overlying the third barrier layer, the second barrier layer is provided overlying the first quantum well, the front-gate is provided overlying the second barrier layer, and the first terminal is a patterned collector and the first quantum well is a patterned emitter wherein the patterned emitter only overlies the patterned collector in a predefined region so that the first barrier layer is only interspersed between the patterned emitter and the patterned collector in a predetermined conduction region.

2. The semiconductor device according to claim 1, wherein said patterned collector and patterned emitter are substantially elongate sections.

3. The semiconductor device according to claim 2, wherein said substantially elongate sections are substantially rectangular.

4. The semiconductor device according to claim 1, wherein said patterned emitter is arranged substantially perpendicular to the patterned collector.

5. The semiconductor device according to claim 1, wherein said patterned collector and patterned emitter comprise a plurality of sections arranged so that said first and third barrier layers are mutually separated and only interspersed between said patterned collector and the patterned emitter in predefined regions.

6. The semiconductor device according to claim 1, wherein a surface of the device comprises oblique facets.

7. The semiconductor device according to claim 6, wherein the first terminal comprises a doped layer, the doped layer further comprising sections of opposing conductivity types.

8. The semiconductor device according to claim 7, wherein said doped layer comprises an amphoteric dopant.

9. The semiconductor device according to claim 6, wherein a doped layer is provided above the patterned collector, and the doped layer further comprises sections of opposing conductivity types.

10. The semiconductor device according to claim 6, wherein said front-gate comprises a doped semiconductor layer, and the dope semiconductor layer further comprises sections of opposing conductivity types.

11. The semiconductor device according to claim 10, wherein said front-gate forms a self aligned gate directly overlying a region where the patterned collector and the patterned emitter overlap.

12. The semiconductor device according to claim 10, wherein said doped semiconductor layer comprises an amphoteric dopant.

13. The semiconductor device according to claim 6, wherein said front-gate further comprises a doped semiconductor layer of a single conductivity type.

14. The semiconductor device according to claim 1, further comprising a relief region with oblique facets such that the first terminal overlies said relief region and said relief region overlies the substrate.

15. The semiconductor device according to claim 1, wherein said patterned collector comprises oblique facets at sidewalls of the patterned collector.

* * * * *